(12) United States Patent
Kim et al.

(10) Patent No.: US 9,519,302 B2
(45) Date of Patent: Dec. 13, 2016

(54) SEMICONDUCTOR APPARATUS INCLUDING MULTICHIP PACKAGE

(71) Applicant: SK hynix Inc., Icheon-si, Gyeonggi-do (KR)

(72) Inventors: Chang Hyun Kim, Icheon-si (KR); Choung Ki Song, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/664,524

(22) Filed: Mar. 20, 2015

(65) Prior Publication Data

US 2016/0161968 A1  Jun. 9, 2016

(30) Foreign Application Priority Data

Dec. 5, 2014 (KR) ................ 10-2014-0174424

(51) Int. Cl.
| | | |
|---|---|---|
| *G11C 5/14* | (2006.01) | |
| *G05F 3/02* | (2006.01) | |
| *G11C 11/4074* | (2006.01) | |
| *G11C 7/10* | (2006.01) | |
| *G11C 11/4093* | (2006.01) | |
| *H01L 25/065* | (2006.01) | |
| *H01L 25/18* | (2006.01) | |

(52) U.S. Cl.
CPC ............... *G05F 3/02* (2013.01); *G11C 5/147* (2013.01); *G11C 7/1066* (2013.01); *G11C 7/1093* (2013.01); *G11C 11/4074* (2013.01); *G11C 11/4093* (2013.01); *H01L 25/0657* (2013.01); *H01L 25/18* (2013.01); *H01L 2224/13025* (2013.01); *H01L 2224/16145* (2013.01); *H01L 2224/16146* (2013.01); *H01L 2224/16225* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2924/0002* (2013.01); *H01L 2924/15311* (2013.01)

(58) Field of Classification Search
CPC ........ G05F 3/02; G11C 5/147; G11C 11/4074; H01L 25/0657; H01L 2225/06541
USPC ........................... 365/226, 227, 229
See application file for complete search history.

(56) References Cited

U.S. PATENT DOCUMENTS

| | | | |
|---|---|---|---|
| 2012/0068360 A1* | 3/2012 | Best | ............... H01L 23/481 257/774 |
| 2013/0070540 A1 | 3/2013 | Pyeon | |
| 2016/0086919 A1* | 3/2016 | Lee | ............... H01L 23/481 257/698 |
| 2016/0156362 A1* | 6/2016 | Kim | ............... G04F 10/005 327/159 |

FOREIGN PATENT DOCUMENTS

| KR | 1020140127409 | * | 9/2014 |
|---|---|---|---|
| KR | 1020140169873 | * | 12/2014 |

* cited by examiner

*Primary Examiner* — Fernando Hidalgo
(74) *Attorney, Agent, or Firm* — William Park & Associates Ltd.

(57) ABSTRACT

A semiconductor apparatus including a multichip package is disclosed. The semiconductor apparatus includes a slave chip having a slave region and a master region. The slave region is configured to have a first threshold voltage smaller than an operation voltage and the master region is configured to have a second threshold voltage greater than the operation voltage.

9 Claims, 7 Drawing Sheets

SEMICONDUCTOR APPARATUS INCLUDING MULTICHIP PACKAGE

CROSS-REFERENCES TO RELATED APPLICATION

This application claims priority under 35 U.S.C. 119(a) to Korean application No. 10-2014-0174424, filed on Dec. 5, 2014, in the Korean intellectual property Office, which is incorporated by reference in its entirety as set forth in full.

BACKGROUND

1. Technical Field

The inventive concept relates to a semiconductor apparatus, and more particularly, to a semiconductor apparatus including multi chips.

2. Related Art

Currently, semiconductor integrated circuit devices having a multichip package structure have been suggested to obtain high degree of integration in a limited space. The multichip package structure may be configured of a plurality of stacked chips, and the plurality of chips may be electrically coupled through silicon vias (TSVs). The plurality of chips stacked in the multichip package may be configured of a master chip and a slave chip. Even when the master chip and the slave chip have the same circuit configuration, the chips may perform different operations from each other according to whether the chips are used as the master chip or the slave chip.

SUMMARY

According to an embodiment, there is provided a semiconductor apparatus. The semiconductor apparatus may include a master chip including a first master region and a first slave region. The semiconductor apparatus may also include a slave chip stacked on the master chip and including a second master region and a second slave region. Further, the semiconductor apparatus may include a voltage providing unit configured to set the first master region, the first slave region, and the second slave region to a first threshold voltage smaller than an operation voltage and set the second master region to a second threshold voltage greater than the operation voltage.

According to an embodiment, there is provided a multichip package. The multichip package may include a master chip mounted on a substrate, configured to receive an external signal through the substrate, and including a master region and a slave region, a plurality of slave chips stacked on the master chip. Each of the slave chips including a required driving region and a non-required driving region. The multichip package may also include a voltage providing unit configured to provide voltages to the master region and the slave region of the master chip and the required driving regions and the non-required driving regions. The voltage providing unit may be configured to provide a first internal voltage to the master region of the master chip; provide a second internal voltage having the same level as the first internal voltage to the slave region of the master chip; provide the first internal voltage to the required driving regions; and provide the second internal voltage smaller than the first internal voltage to the non-required driving regions.

According to an embodiment, there is provided a memory system. The memory system may include a controller, and a memory apparatus including a plurality of semiconductor chips configured to communicate with the controller. The memory apparatus may include a master chip including a first master region and a first slave region, a slave chip stacked on the master chip and including a second master region and a second slave region. The memory apparatus may also include a voltage providing unit configured to provide a first internal voltage to the first master region and the first slave region, provide a second internal voltage smaller than the first internal voltage to the second master region, and provide the first internal voltage to the second slave region. The voltage providing unit may boost a threshold voltage of the second master region greater than that of the second slave region According to an embodiment, there is provided a semiconductor apparatus. The semiconductor apparatus may include a slave chip having a slave region and a master region. The slave region may be configured to have a first threshold voltage smaller than an operation voltage and the master region may be configured to have a second threshold voltage greater than the operation voltage.

DETAILED DESCRIPTION

Hereinafter, various embodiments will be described in greater detail with reference to the accompanying figures. Various embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, various embodiments should not be construed as limited to the particular shapes of regions illustrated herein but may be to include deviations in shapes that result, for example, from manufacturing. In the figures, lengths and sizes of layers and regions may be exaggerated for clarity. Like reference numerals in the figures denote like elements. It is also understood that when a layer is referred to as being "on" another layer or substrate, it can be directly on the other or substrate, or intervening layers may also be present.

The inventive concept is described with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these various embodiments without departing from the principles and spirit of the inventive concept.

Figure 1:
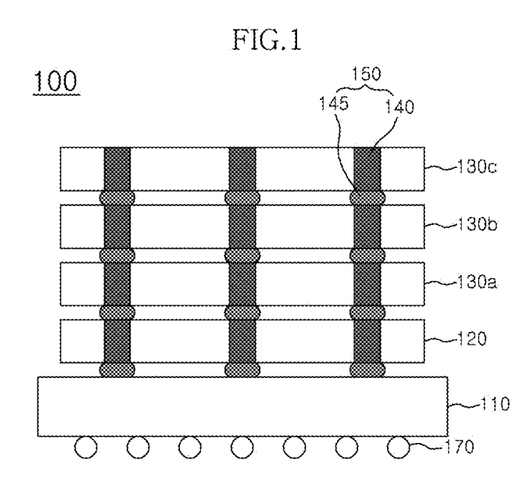
FIG. 1 is a cross-sectional view illustrating a multichip package according to an embodiment of the inventive concept.
Figure 2:
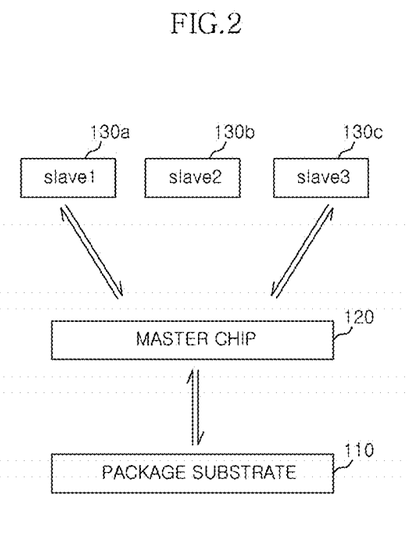
FIG. 2 is a conceptual view illustrating a multichip package according to an embodiment of the inventive concept.

Referring to FIGS. 1 and 2, a semiconductor package 100 may include a package substrate 110, a master chip 120, and a plurality of slave chips 130a to 130c.

The package substrate 110 may be, for example, a printed circuit board (PCB). The package substrate 110 may interface with an external device to exchange signals and data. Further, the package substrate 110 may support the master chip 120 and the plurality of slave chips 130a to 130c.

The master chip 120 may include a master region configured to interface with the outside of the semiconductor package 100, such as for example, the external device. The master chip 120 may further include a slave region configured to interface with the master region and perform a read/write operation of the slave chips 130a to 130c. The slave region may be electrically coupled to the master region and may transmit/receive various control signals and data to/from the master region.

The plurality of slave chips 130a to 130c may be stacked on the master chip 120. Each of the slave chips 130a to 130c may include a slave region configured to perform a memory operation, for example, the read/write operation. The plurality of slave chips 130a to 130c may have the same configuration as the master chip 120. Accordingly, each of the slave chips may further include a master region. Each of the slave chips 130a to 130c may include a required driving region and a non-required driving region. Further, the required driving region is a slave region and the non-required driving region is a master region.

The master chip 120 and the slave chips 130a to 130c may be semiconductor chips having a memory function. The master chip 120 may be mounted on the package substrate 110 and electrically coupled to the package substrate 110. The plurality of slave chips 130a to 130c may be stacked on the master chip 120 and electrically coupled to the master chip 120.

In various embodiments, the phase "electrically coupled" means "mutually transfer data and signals." In an embodiment, a TSV 140 and a bump 145 may be used as a connection terminal 150.

When data and a signal are transferred to the master chip 120 from the external device, the data and signal may be transferred to a bonding pad of the package substrate 110 through an external connection terminal such as a solder ball 170 and an internal circuit wiring of the package substrate 110. The data and signal may then be provided to the master chip 120 through the TSV 140 electrically coupled to the bonding pad. When data and a signal are transferred to an external apparatus from the master chip 120, the data and signal may be transferred to the bonding pad of the package substrate 110 through the TSV 140 electrically coupled to the bonding pad from the master chip 120. The data and the signal may then be provided to the external apparatus through the internal circuit wiring of the package substrate 110 and the external connection terminal 170.

When data and a signal are transferred to the slave chips 130a to 130c from the master chip 120, the data and signal may be transferred from a bonding pad (not shown) of the master chip 120 to bonding pads (not shown) of the slaves 130a to 130c through the connection terminal 150 such as the TSV 140 and the bump 145. When data and a signal are transferred to the master chip 120 from the slave chips 130a to 130c, the data and signal may be transferred to the bonding pads of the slave chips 130a to 130c to the bonding pad of the master chip 120 through the connection terminal 150.

Although not illustrated in FIGS. 1 and 2, the master chip 120 and the slave chips 130a to 130c may be encapsulated with an encapsulant such as an epoxy molding compound or the like.

Figure 3:
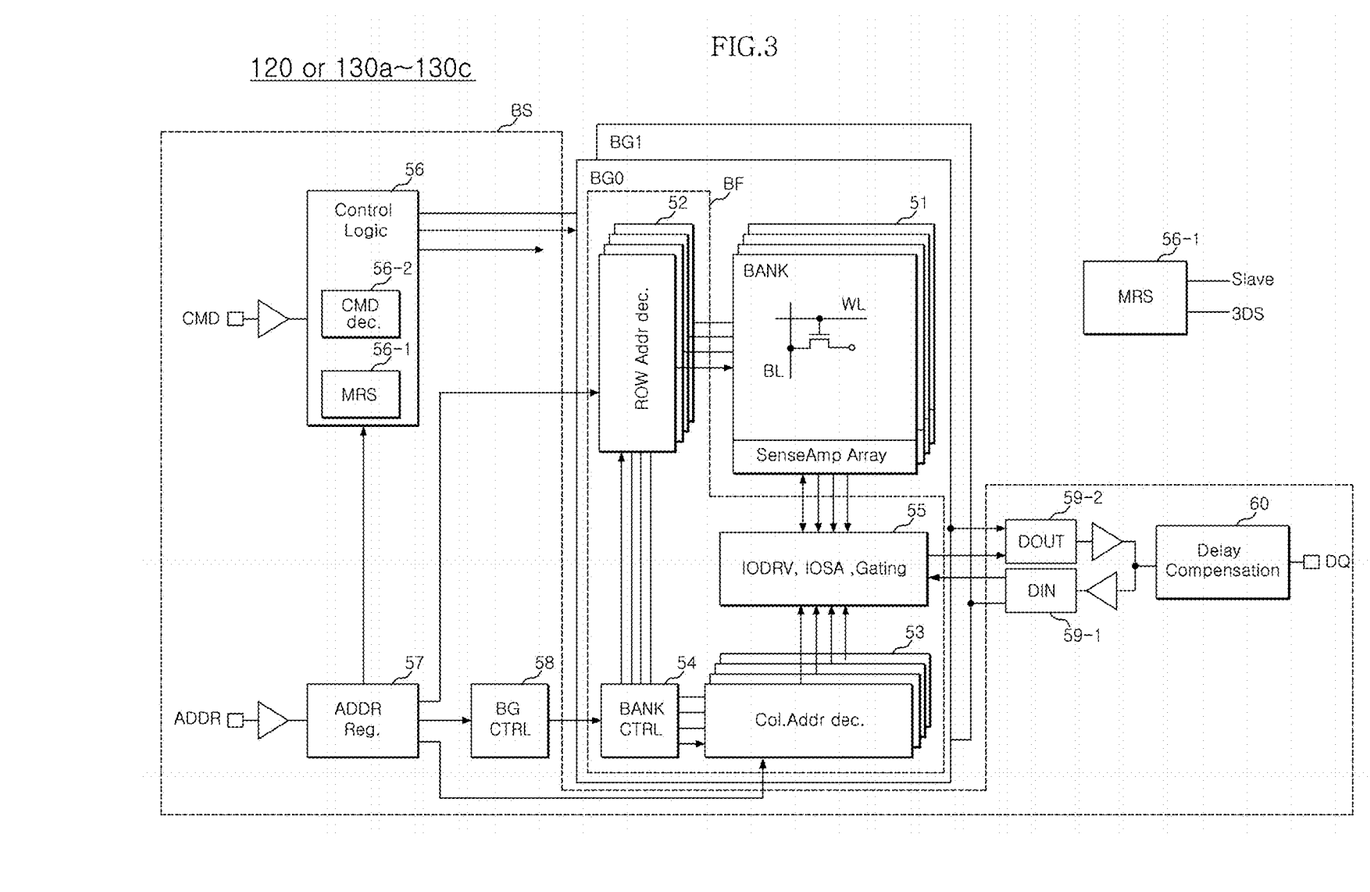
FIG. 3 is a schematic block diagram illustrating a circuit configuration of a master chip or a slave chip according to an embodiment of the inventive concept.

The master chip 120 and the slave chips 130a to 130c may be, for example, a memory chip such as a dynamic random access memory (DRAM). Memory cores of the master chip 120 and the slave chips 130a to 130c may include a plurality of memory banks as illustrated in FIG. 3. The banks may be defined as an array of memory cells configured to activate memories simultaneously accessed, and may be commonly divided by a bank address.

The rank generally mentioned on the memory module including at least one DRAM chip may be an assembly of DRAM chips which simultaneously receive the same command, bank address, and address. For example, the rank may be divided into the master chip 120 and the slave chips 130a to 130c or the plurality of slave chips to which the same signals are provided may be interpreted as one rank. In general, the ranks may be divided by a chip select signal provided to a memory module.

Each of the master chip 120 and the slave chips 130a to 130c may include a plurality of memory banks 51, and also may include various circuit blocks configured to control read and write operations of the memory bank 51.

More specifically, each of the master chip 120 and the slave chips 130a to 130c may include a plurality of bank groups BG0 and BG1. Each of the plurality of bank groups BG0 and BG1 may include a first control block BF configured to control operations of the memory bank 51. The first control block BF may include a row address decoder 52, a column address decoder 53, a bank controller 54, and an input/output (I/O) driver 55.

The master chip 120 and the slave chips 130a to 130c may include a second control block BS corresponding to a peripheral circuit outside the bank groups BG0 and BG1. The second control block BS may include a control logic 56 including a mode register set (MRS) 56-1 and a command decoder 56-2. The second control block BS may also include an address register 57 configured to temporarily store an address ADDR, a bank group controller 58 configured to control the bank group, and a data input unit 59-1. Further, the second control block BS may also include a data output unit 59-2 configured to control input/output data from/to an external memory controller.

In an embodiment, the mode register set 56-1 may further set a slave chip determination signal Slave to determine whether a selected chip is the master chip 120 or the slave chips 130a to 130c and a stacking determination signal 3DS to determine whether the chip is a stacking chip or a single chip. Further, the second control block BS may further include a delay compensation circuit unit 60 configured to compensate delay in the transfer of data or a signal. The slave chip determination signal Slave and the stacking determination signal 3DS may be set in a control block of the master chip 120.

In an embodiment, the bank groups BG0 and BG1 including the memory bank 51 and the first control block BF may correspond to a slave region. Further, the second control block BS may correspond to a master region.

Referring to FIG. 3, the plurality of memory banks 51 defined as the first bank group BG0 may receive write data from the I/O driver 55 or output read data to the I/O driver (IODRV) 55 according to output signals of the row address decoder 52 and the column address decoder 53 and the control of the bank controller 54. The control logic 56 may receive a command CMD from the outside and perform a decoding operation on the received command CMD according to setting of the mode register set 56-1. The address register 57 temporarily stores the received address ADDR. The address register 57 also provides an address related to bank group control to the bank group controller 58, and provides a row address and a column address to the row address decoder 52 and the column address decoder 53, respectively. Data may be written in any one bank among the plurality of memory banks 51 using the command CMD, the address ADDR, and the write data received through the data input unit 59-1. Further, data read from any one bank among the plurality of memory banks 51 may be output to the outside through the data output unit 59-2 according to the command CMD and the address ADDR.

Figure 4:
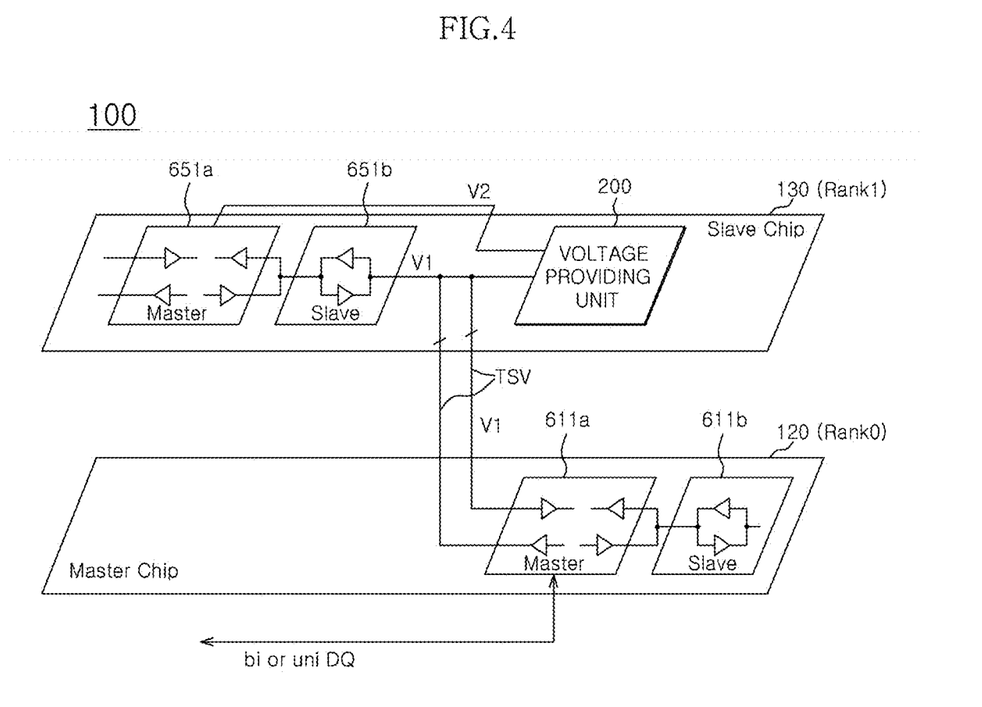
FIG. 4 is a schematic view illustrating a multichip package including a voltage providing unit according to an embodiment of the inventive concept.

Referring to FIG. 4, a schematic view illustrating a multichip package 100 including a voltage providing unit according to an embodiment of the inventive concept is shown.

In FIG. 4, the multichip package 100 in an embodiment may include a master chip 120 and a slave chip 130.

The master chip 120 may include a master region 611a and a slave region 611B. Since the current slave chip 130 is configured of the same chip as the master chip 120, the slave chip 130 may include a master region 651a and a slave region 651b like the master chip 120. However, the master region 651a of the slave chip 130 does not take part in an actual control operation unlike the master chip 120.

The master region 611a of the master chip 120 (hereinafter, referred to as a main master region) may interface with an external device. The master region 611a may also transmit and receive a command/address and data to/from the slave region 611b inside the master chip 120 and/or the slave region 651b of the slave chip 130. The data interface between the master chip 120 and the slave chip 130 may be performed through a TSV.

A plurality of semiconductor chips 120 and 130 included in the multichip package 100 in an embodiment may include the plurality of banks as described in FIG. 3. In addition, the memory banks of each chip may be controlled through a control block of the master chip 120, that is, the main master region.

Memory banks included in the inside of the master chip 120 may be defined as a first rank rank0. Further, memory banks included in the inside of the slave chip 130 may be defined as a second rank rank1. When additional semiconductor chips are included in the multichip package 100, memory banks included in the additional semiconductor chips may be defined as a third rank rank2, a fourth rank rank3, and the like.

When the chips in the multichip package are defined as a plurality of ranks, as a data bus of the main master region 611a to an external apparatus, a unidirectional data bus uni DQ or a bidirectional data bus (bi DQ) may be used.

As described above, as the master chip 120 and the slave chip 130 are configured of the same kind of chip, the slave chip 130 may include the master region 651a which needs not to be actually driven (hereinafter, referred to as a sub master region). In the conventional art, unexpected off current occurs due to driving of the sub master region 651a.

In an embodiment, the multichip package 100 may include a voltage providing unit 200 to individually control the sub master region 651a serving as an off current source.

The voltage providing unit 200 in an embodiment may be an internal voltage (bulk voltage) providing unit configured to control threshold voltages of the master regions 611a and 651a and the slave regions 611b and 651b of the chips. The voltage providing unit 200 may be designed to provide dualized bulk voltages to the master chip 120 and the slave chip 130. The voltage providing unit 200 may be formed in any one selected from the master chip 120 and the slave chip 130. However, the voltage providing unit 200 may be located in the slave chip 130 having a relatively large area margin.

The voltage providing unit 200 may output a first internal voltage V1 and a second internal voltage V2. The first internal voltage V1 may be provided to the slave regions 611b and 651b of the chips 120 and 130. In addition, the second internal voltage V2 may be provided to the master regions 611a and 615a of the chips 120 and 130. The first and second internal voltages V1 and V2 may have the same level as or different levels from each other according to the kinds of chips.

When the first and second internal voltages V1 and V2 are provided to the master chip 120, the voltage providing unit 200 may be designed to output the first and second internal voltages V1 and V2 having the same level. When the first and second internal voltages V1 and V2 are provided to the slave chip 130, the voltage providing unit 200 may be designed to output the first and second internal voltages V1 and V2 having different levels from each other.

Figure 5:
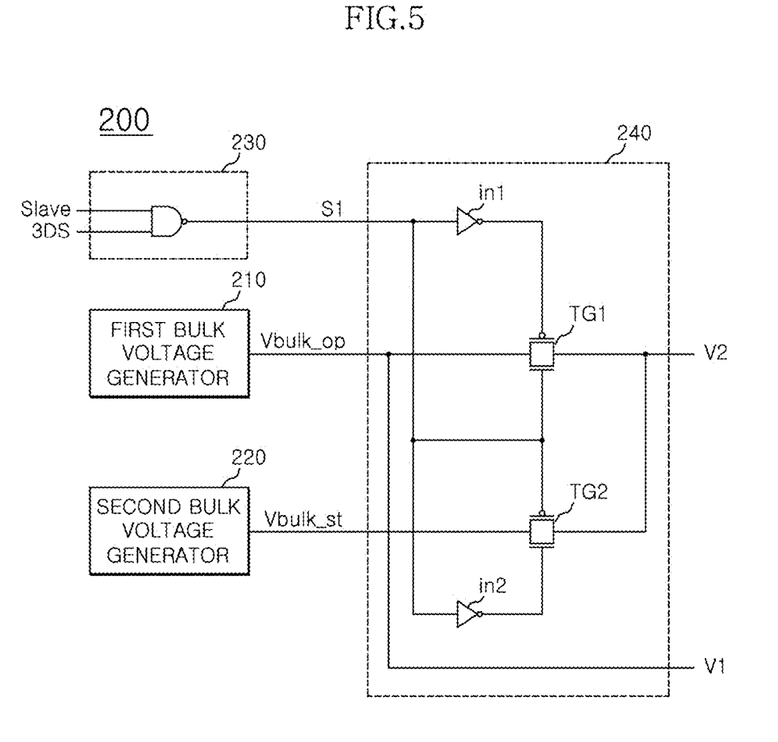
FIG. 5 is an internal circuit diagram illustrating a voltage providing unit according to an embodiment of the inventive concept.

Referring to FIG. 5, the voltage providing unit 200 may include a first bulk voltage generator 210, a second bulk voltage generator 220, a setting circuit unit 230, and a selection unit 240.

The first bulk voltage generator 210 generates an operation bulk voltage Vbulk_op and outputs the generated operation bulk voltage Vbulk_op. The operation bulk voltage Vbulk_op may have a voltage level in which the circuit units 611a, 611b, 651a, and 651b of the master chip 120 and the slave chip 130 can generate threshold voltages suitable for the set operation voltage. For example, a ground (Vss) voltage may be used as the operation bulk voltage Vbulk_op in an embodiment.

The second bulk voltage generator 220 generates a standby bulk voltage Vbulk_st and outputs the generated standby bulk voltage Vbulk_st. The standby bulk voltage Vbulk_st has a lower voltage level than the operation bulk voltage Vbulk_op. The standby bulk voltage Vbulk_st also serves to boost the threshold voltages of the circuit units. When the standby bulk voltage Vbulk_st is provided as a bulk voltage, the threshold voltage of a corresponding circuit unit is boosted greater than the operation voltage. Further, the corresponding circuit unit is not turned on. In an embodiment, a negative voltage VBB having a lower voltage level than the operation bulk voltage Vbulk_op may be used as the standby bulk voltage Vbulk_st. The first and second bulk voltage generators 210 and 220 may include a general voltage regulator.

The setting circuit unit 230 performs an NAND operation on the slave chip determination signal Slave and the stacking determination signal 3DS. The setting circuit unit 230 also outputs a setting signal S1 indicating a package chip state. For example, when a semiconductor package is a multichip package, the stacking determination signal 3DS becomes a high level signal. In addition, when a corresponding chip of the multichip package is a slave chip, the slave chip determination signal Slave becomes a high level signal. The slave chip determination signal Slave and the stacking determination signal 3DS may be provided from the mode register set (MRS) 56-1 of the master chip 120. In the alternative, the slave chip determination signal Slave and the stacking determination signal 3DS may be provided from an external controller to be described later or other logic circuits. The setting circuit unit 230 may be configured to generate a control signal of the selection unit 240 according to a signal for setting a chip to which a first internal voltage V1 and second internal voltage V2 are output. The setting circuit unit 230 may be configured to set the output condition according to a slave chip determination signal Slave to determine whether a semiconductor chip to which the first and second internal voltages are output is the master chip or the slave chip. In addition, the setting circuit unit 230 may be configured to set the output condition according to a stacking determination signal 3DS. The setting circuit unit may be configured to set the output condition according to the slave chip determination signal Slave and the stacking determination signal 3DS to determine whether or not the semiconductor apparatus is a multichip package in which at least two semiconductor chips are stacked.

The selection unit 240 may be configured to output the operation bulk voltage Vbulk_op as the first and second internal voltages V1 and V2 according to the setting signal S1. Further, the selection unit 240 may be designed to output the operation bulk voltage Vbulk_op as the first internal voltage V1 and the standby bulk voltage Vbulk_st as the second internal voltage V2 according to the setting signal S1. The first internal voltage V1 may be provided to a slave region of the slave chip 130a-130c and the second internal voltage V2 may be provided to a master region of the slave chip 130a-130C.

The selection unit 240 in an embodiment may include a first inverter in1, a second inverter in2, a first transfer gate TG1, and a second transfer gate TG2.

The first inverter in1 inverts the setting signal S1. The first inverter in1 also provides the inverted setting signal S1 to a gate of a PMOS transistor of the first transfer gate TG1. The second inverter in2 inverts the setting signal S1. Further, the second inverter in2 provides the inverted setting signal S1 to a gate of an NMOS transistor of the second transfer gate TG2. A gate of an NMOS transistor of the first transfer gate TG1 and a gate of a PMOS transistor of the second transfer gate TG2 may be electrically coupled to receive the setting signal S1.

An operation of the voltage providing unit 200 having the above-described configuration will be described below.

First, when a bulk voltage has to be provided to the master chip 120 in a multichip package structure, the stacking determination signal 3DS is enabled to a high level. Further, the slave chip determination signal Slave is disabled to a low level. Therefore, the circuit setting unit 230 outputs the setting signal S1 of a high level.

In response to the setting signal S1 having a high level, the first transfer gate TG1 of the selection unit 240 is driven and the second transfer gate TG2 of the selection unit 240 is not driven. Therefore, the operation bulk voltage Vbulk_op which is an output signal of the first bulk voltage generator 210 is output as the first and second internal voltages V1 and V2. Accordingly, both the master region 611a and the slave region 611b of the master chip 120 receive the operation bulk voltage Vbulk_op, and are also driven under a normal threshold voltage Vth1 with respect to the set operation voltage.

When a bulk voltage has to be provided to the slave chip 130 in a multichip package structure, both the stacking determination signal 3DS and the slave chip determination signal Slave are enabled to a high level. Therefore, the setting circuit unit 230 outputs the setting signal S1 of a low level.

According to the setting signal S1 of a low level, the second transfer gate TG2 of the selection unit 240 is driven and the first transfer gate TG1 is not driven. Therefore, the operation bulk voltage Vbulk_op is provided as the first internal voltage V1 to the slave region 651b of the slave chip 130. In addition, the standby bulk voltage Vbulk_st is provided as the second internal voltage V2 to the master region 651a of the slave chip 130 which is the sub master region. The slave region 651b of the slave chip 130 is driven under the normal threshold voltage Vth1 by the operation bulk voltage Vbulk_op. A threshold voltage Vth2 higher than the normal threshold voltage Vth1 is constructed in the sub master region 651a by the standby bulk voltage Vbulk_st, and thus the sub master region 651a is not substantially driven. The slave region 651b is configured to have a first threshold voltage Vth1 smaller than an operation voltage and the master region 651a is configured to have a second threshold voltage Vth2 greater than the operation voltage.

Threshold voltages Vth of circuit regions configured of MOS transistors will be represented by the following equation.

$$Vth = VFB + \frac{r}{\sqrt{2\varphi f}}\left(\sqrt{(1} + \frac{Vsb}{2\varphi f}\right) - 1\right) \quad \text{[Equation 1]}$$

Here, VFB is a flat band voltage of a MOS transistor (a threshold voltage Vth when a body voltage is not provided), $\varphi f$ is work function of a gate electrode, Vsb is a substrate voltage, that is, a bulk voltage, and r is a body effect.

According to Equation 1, it can be seen that as the bulk voltage (substrate voltage Vsb) is reduced, the threshold voltage is increased.

When the bulk voltage (substrate voltage) of a circuit region which has to be non-driven in the slave chip 130, or, the sub master region 651a is relatively lowered by the Equation 1 and provided, the threshold voltage of the sub master region 651a is increased as a result.

When threshold voltages of the main master region 611a and the slave regions 611b and 651b are a first threshold voltage Vth1, and a threshold voltage of the sub master region 651a is a second threshold voltage Vth2, it is assumed that an operation voltage VDD between the first threshold voltage Vth1 and the second threshold voltage Vth2 (Vth1<VDD<Vth2) is provided to the master chip 120 and the slave chip 130.

When the operation voltage VDD is input, since the voltage equal to or greater than the first threshold voltage Vth1 is provided to the main master region 611a and the slave region 611b of the master chip 120, and the slave region 651b of the slave chip 130 as the operation voltage, the main master region 611a and the slave region 611b of the master chip 120, and the slave region 651b of the slave chip 130 are turned on.

Since a voltage smaller than the second threshold voltage Vth2 is provided to the sub master region 651a of the slave chip 130 as the operation voltage, the sub master region 651a of the slave region 130 is not turned on as a result.

Therefore, an undesired operation of the sub master region 651a of the slave chip 130 which does not have to be inevitably driven may be prevented accordingly.

Figure 6:
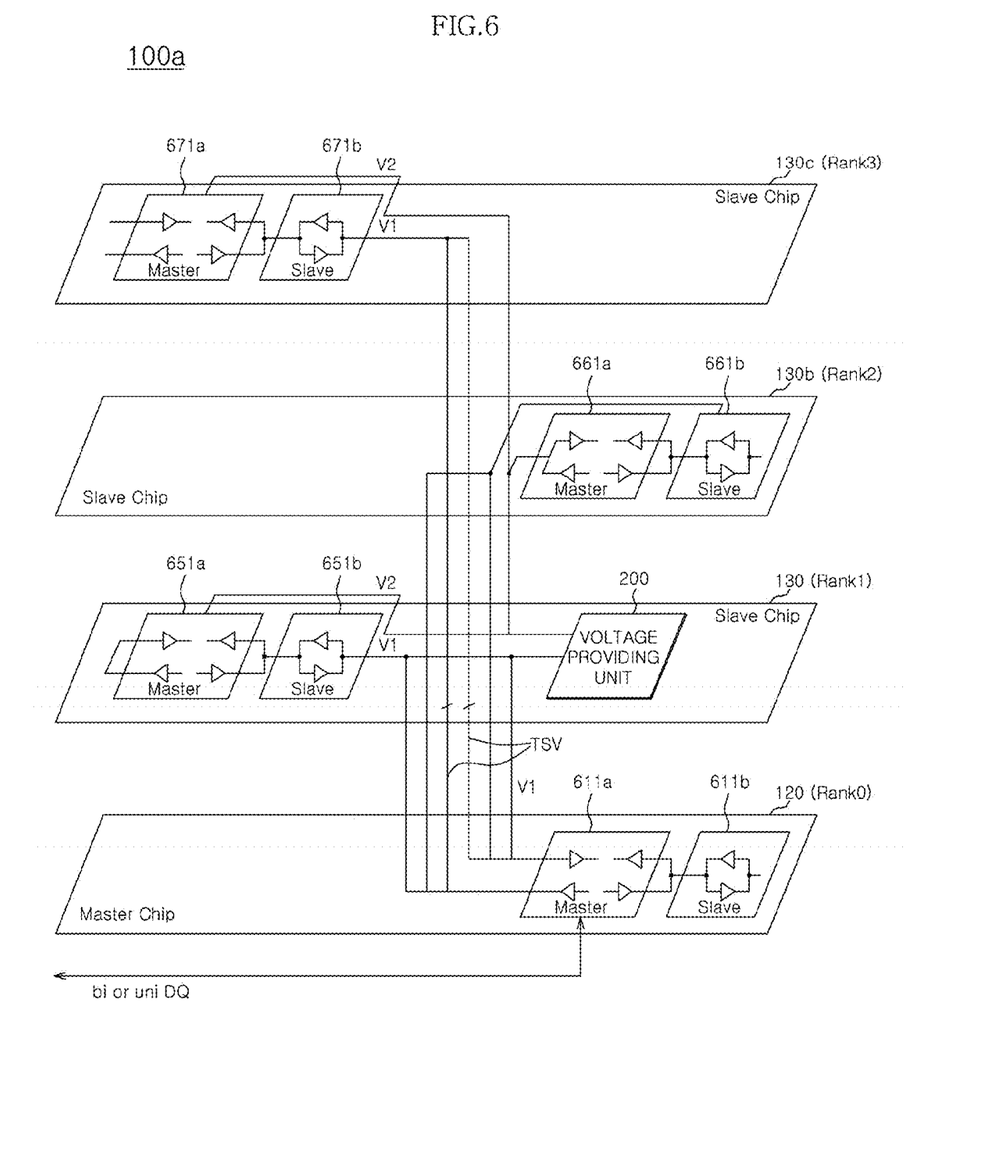
FIG. 6 is a schematic view illustrating a multichip package including a voltage providing unit according to an embodiment of the inventive concept.

Referring to FIG. 6, a plurality of slave chips 130a to 130c may be stacked to constitute a semiconductor package 100a.

A voltage providing unit 200 may be located in one selected from among the slave chips 130a to 130c. The voltage providing unit 200 may selectively provide the standby bulk voltage Vbulk_st to sub master regions 651a, 661a, and 671a of a plurality of stacked slave chips 130a to 130c as the second internal voltage. The sub master regions 651a, 661a, and 671a and the slave regions 651b, 661b, and 671b of the stacked slave chips 130a to 130c may receive the bulk voltages through a TSV and a conductive wiring.

Figure 7:
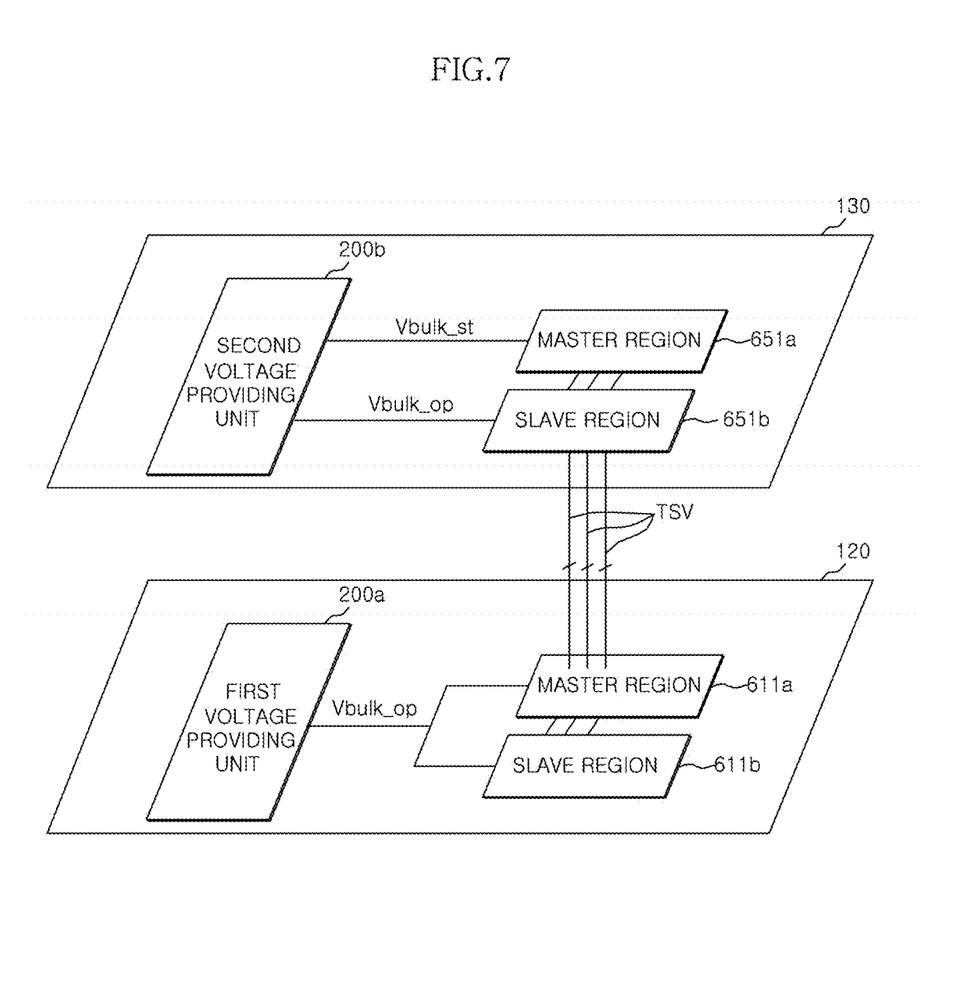
FIG. 7 is a schematic view illustrating a multichip package including a voltage providing unit according to an embodiment of the inventive concept.

Referring to FIG. 7, a first voltage providing unit 200a is provided in a master chip 120. In addition, a second voltage providing unit 200b may be provided in a slave chip 130.

The first voltage providing unit 200a may be a voltage regulator configured to generate the operation bulk voltage Vbulk_op. Further, the operation bulk voltage Vbulk_op provided from the first voltage providing unit 200a may be provided to the master region 611a and the slave region 611b of the master chip 120.

The second voltage providing unit 200b may generate the operation bulk voltage Vbulk_op and the standby bulk voltage Vbulk_st. The second voltage providing unit 200b may also provide the standby bulk voltage Vbulk_st to a master region 651a of the slave chip 130, and provide the operation bulk voltage Vbulk_op to the slave region 651b of the slave chip 130.

Figure 8:
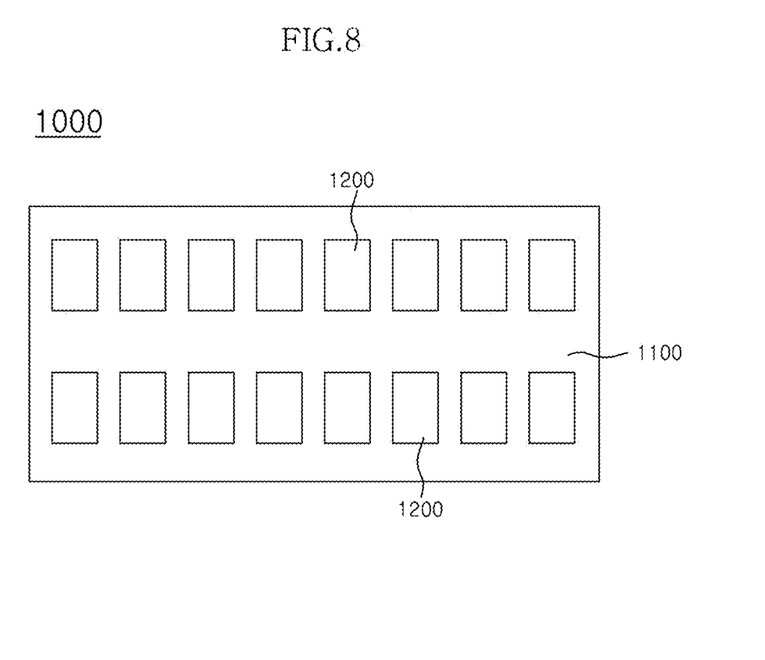
FIG. 8 is a plan view illustrating a memory module including a multichip package according to the technical spirit of the inventive concept.

Referring to FIG. 8, a plan view illustrating a memory module 1000 including a multichip package according to the technical spirit of the inventive concept is shown.

In FIG. 8, the memory module 1000 may include a PCB 1100 and a plurality of semiconductor packages 1200. The plurality of semiconductor packages 1200 may include at least one of the semiconductor packages according to embodiments of the inventive concept.

The memory module 1000 according to the technical spirit of the inventive concept may have a single in-lined memory module (SIMM) type in which the plurality of semiconductor packages 1200 are mounted on one surface of the PCB 1100 or a dual in-lined memory module (DIMM) type in which the plurality of semiconductor packages 1200 are arranged on both surfaces of the PCB 1100. Further, the memory module 1000 in an embodiment may have a fully buffered DIMM type having an advanced memory buffer (AMB) configured to provide external signals to the plurality of semiconductor packages 1200.

Figure 9:
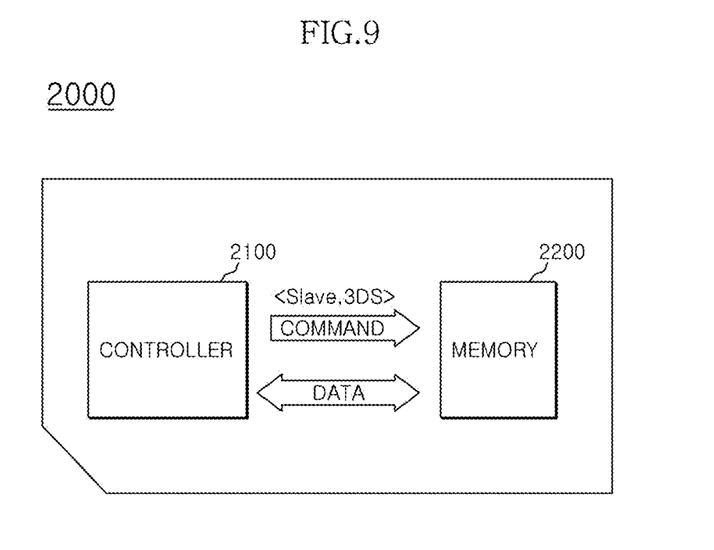
FIG. 9 is a plan view illustrating a memory system including a multichip package according to the technical spirit of the inventive concept.

Referring to FIG. 9, a schematic view illustrating a memory system including a multichip package according to the technical spirit of the inventive concept is shown.

In FIG. 9, a memory system 2000 may be arranged to exchange electrical signals between a controller 2100 and a memory 2200.

For example, when a command is provided from the controller 2100, the memory 2200 may transmit data to the controller 2100 according to the command. In some cases, when the slave chip determination signal Slave and the stacking determination signal 3DS are not set in the mode register set (MRS) 56-1 of FIG. 3, the slave chip determination signal Slave and the stacking determination signal 3DS may be provided from the controller 2100.

The memory 2200 may be the semiconductor memory device according to various embodiments of the inventive concept.

The memory system 2000 may be implemented with various memory cards such as a memory stick card, a smart media card (SM), a secure digital card (SD), a mini SD, and a multimedia card (MMC).

The embodiments have described the master region as non-required operation circuit of the slave chip, but this is not limited thereto. All circuit parts which do not have to be inevitably driven may be included in the master region.

The above embodiments of the invention are illustrative and not limitative. Various alternatives and equivalents are possible. The invention is not limited by the embodiment described. Nor is the invention limited to any specific type of semiconductor device. Other additions, subtractions, or modifications are obvious in view of the invention and are intended to fall within the scope of the appended claims.

What is claimed is:

1. A semiconductor apparatus comprising:
    a master chip including a first master region and a first slave region;
    a slave chip stacked on the master chip and including a second master region and a second slave region; and
    a voltage providing unit configured to set the first master region, the first slave region, and the second slave region to a first threshold voltage smaller than an operation voltage and set the second master region to a second threshold voltage greater than the operation voltage,
    wherein the voltage providing unit is configured to provide an operation bulk voltage to the first master region, the first slave region, and the second slave region, and a standby bulk voltage smaller than the operation bulk voltage to the second master region.

2. The semiconductor apparatus of claim 1, wherein the voltage providing unit is located in one selected from the master chip and the slave chip.

3. The semiconductor apparatus of claim 1, wherein the voltage providing unit includes:
    a first bulk voltage generator configured to generate the operation bulk voltage;
    a second bulk voltage generator configured to generate the standby bulk voltage;
    a setting circuit unit configured to set an output condition of the standby bulk voltage; and
    a selection unit configured to receive the operation bulk voltage and the standby bulk voltage, and selectively output the operation bulk voltage and the standby bulk voltage as a first internal voltage and a second internal voltage.

4. The semiconductor apparatus of claim 3, wherein the setting circuit unit is configured to set the output condition according to a slave chip determination signal to determine whether a semiconductor chip to which the first and second internal voltages are output is the master chip or the slave chip, and a stacking determination signal to determine whether or not the semiconductor apparatus is a multichip package in which at least two semiconductor chips are stacked.

5. The semiconductor apparatus of claim 4, wherein the slave chip determination signal and the stacking determination signal are set in a control block of the master chip.

6. The semiconductor apparatus of claim 4, wherein the selection unit is configured to output the operation bulk voltage as the first and second internal voltages when the semiconductor apparatus is a multichip package, and the first and second internal voltages are provided to the master chip.

7. The semiconductor apparatus of claim 6, wherein the selection unit is configured to output the operation bulk voltage as the first internal voltage and the standby bulk voltage as the second internal voltage when the semiconductor apparatus is a multichip package and the first and second internal voltages are provided to the slave chip, and the first internal voltage is provided to the second slave region of the slave chip, and the second internal voltage is provided to the second master region of the slave chip.

8. The semiconductor apparatus of claim 3, wherein the operation bulk voltage is a ground voltage (VSS) and the standby bulk voltage is a negative voltage (VBB).

9. A semiconductor apparatus comprising:

a slave chip having a slave region and a master region, wherein the slave region is configured to have a first threshold voltage smaller than an operation voltage and the master region is configured to have a second threshold voltage greater than the operation voltage, wherein the slave chip includes a voltage providing unit, and the voltage providing unit is configured to provide an operation bulk voltage to the slave region, and provide a standby bulk voltage having a smaller level than the operation bulk voltage to the master region.

* * * * *